United States Patent [19]

Randin et al.

[11] Patent Number: 4,743,855
[45] Date of Patent: May 10, 1988

[54] METHOD OF AND APPARATUS FOR MEASURING THE STATE OF DISCHARGE OF A BATTERY

[76] Inventors: Jean-Paul Randin, Potat-Dessus 13, 2016-Cortaillod; Frédy Zuellig, Saint-Germain 2, 2800-Delemont; Claude-Eric Leuenberger, Grand Chézard 5, 2054 Chezard, all of Switzerland

[21] Appl. No.: 926,838

[22] Filed: Nov. 3, 1986

Related U.S. Application Data

[63] Continuation of Ser. No. 675,908, Nov. 28, 1984, abandoned.

[30] Foreign Application Priority Data

Dec. 12, 1983 [FR] France .............................. 83 19979

[51] Int. Cl.[4] ............................................. G01N 27/46
[52] U.S. Cl. ..................................... 324/430; 320/48; 340/636; 324/427
[58] Field of Search ............... 324/426, 427, 429, 430; 320/48; 340/636; 364/482, 484

[56] References Cited

U.S. PATENT DOCUMENTS 3,984,762 10/1976 Dowgiallo .......................... 324/430
4,259,639 3/1981 Renirie ........................... 324/426 X

OTHER PUBLICATIONS

Karunathilaka et al., "The Impedance of the Alkaline Zinc-Mercury Oxide Cell. I. Cell Behavior and Interpretation of Impedance Spectra" in Journal of Applied Electrochemistry, vol. 11 (1981), pp.573–582.
Sathyanarayana et al. "Impedance Parameters and the State-of-Charge. I. Nickle-Cadium Battery" in Journal of Applied Electrochemistry, vol. 9 (1979) pp. 125–139.
Karunathilaka et al. "A State-of-Charge Test for the Li-CuO Cell" in journal of Applied Electrochemistry, vol. 13 (1983) pp. 351–354.
Karunathilaka et al. "The Prediction of the State-of-Charge of Some Primary Cells" in Journal of Applied Electrochemistry, vol. 13 (1983) pp. 577–586.

*Primary Examiner*—Reinhard J. Eisenzopf
*Assistant Examiner*—Robert W. Mueller

[57] ABSTRACT

A method is described of measuring the state of discharge of a battery, i.e. the ratio between the supplied capacity and the nominal capacity.

The method consists in measuring a first internal impedance of the battery at a first frequency and a second internal impedance of the battery at a second frequency, then in determining the argument of the difference between the internal impedances, the resulting argument being representative of the state of discharge of the battery.

The method can be used to advantage to check in a rapid, accurate and non-destructive way whether batteries to be used in portable appliances, e.g. electronic watches, are in good working order before being fitted into the appliances.

5 Claims, 2 Drawing Sheets

METHOD OF AND APPARATUS FOR MEASURING THE STATE OF DISCHARGE OF A BATTERY

This is a continuation of application Ser. No. 675,908, filed Nov. 28, 1984 and now abandoned.

BACKGROUND OF THE INVENTION

1. Field of the Invention

This invention relates to a non-destructive measuring or testing method for ascertaining the state of discharge of a battery. It also relates to apparatus or an instrument for carrying out the method.

Electrically, a battery is characterized by the open circuit voltage between its terminals, by its internal resistance, and by its capacity. The latter, usually expressed in ampere-hours (Ah) or milliampere-hours (mAh), indicates how much current the battery can supply over a given time before its voltage under an appropriate load drops below a predetermined level.

For a used battery, the ratio between the Ah it has supplied to a load and its nominal capacity defines the state of discharge of the battery, this state being referred to as D and being usually expressed in %.

While the open circuit voltage of a battery of a given type is a known and stable parameter, there may be some discrepancy between its capacity and the nominal value. As for the state of discharge of a battery, this depends on the way in which it was used or even stocked, i.e. on its history. Indeed, even while being stocked at ambient temperature a battery has a tendency to lose its charge, so that its state of discharge cannot therefore be precisely known, except by measurement.

2. Prior Art

The known methods for determining the state of discharge D of a battery unfortunately are difficult to carry out and are inaccurate. They are mainly based either on the measurement of the resistance R or of the complex impedance Z of the battery, or on the measurement of the voltage E under a load, i.e. when the battery is supplying a current i. These are in fact the only parameters that vary significantly with the state of discharge of the battery.

For example, one method of measuring D is to cause the battery to supply progressively increasing current. The voltage reached by the battery after a given time or for a given current, or the value of its d.c. resistance, given by the tangent to the curve $E=f(i)$, can be taken as representative values of the state of discharge of the battery, as described in J. J. Winter et al's article in the Journal of the Electrochemical Society, Vol. 122 (1975) pages 1434–1438 or in Froidevaux's U.S. Pat. No. 4,204,162 of May 1980. This method, besides being complicated to carry out, has also proved to be somewhat inaccurate.

A galvanostatic method has been proposed by F. Kornfeil in an article entitled "Some observations on the prediction of the state of discharge of batteries" in the Journal of the Electrochemical Society, Vol 123 (1976) pages 1271–1276. It consists in causing the batter to supply a constant current and in taking its voltage after a predetermined time as representative of its state of discharge. The results obtained by this method of measurement are satisfactory. However, the resistance of the battery, which depends on its state of discharge and varies from one sample to the next, causes the voltage to drop when the direct current is applied and thus produces a scattering in the measurements. An improved measuring method has been proposed by the applicant in French Patent Application No. 83.04430 wherein the resistance of the battery no longer plays a part in determining its state of discharge. This method usually provides good results, but in certain cases lacks accuracy when measuring low values of D.

Finally, various methods of measuring D based on the use of certain parameters of the internal complex impedance Z of the battery have been described in many publications.

For example, in an article by S. Sathyanarayana et al entitled "Impedance parameters and the state-of-charge. I. Nickel-cadmium battery" in the Journal of Applied Electrochemistry, Vol. 9 (1979) pages 125–139, the authors show that the argument a of complex impedance Z, when measured at an adequate frequency, with a also being the phase difference angle between the voltage across the terminals of impedance Z and the current flowing through it, is a parameter whose value is closely related to the state of discharge D of the battery. With this method however, the internal ohmic resistance of the battery, which depends on its state of discharge and may vary from one sample to the next, diminishes the accuracy of the measurements.

The end of vector Z, which represents the internal impedance of the battery, roughly follows an arc of a circle in a complex plane when the measurement frequency f varies approximately from 10 Hz to 10 kHz. The diameter d of the corresponding circle may also be used as a parameter representative of D, as described in S.A.G.R. Karunathilaka et al's article entitled "The impedance of the alkaline zinc-mercuric oxide cell. I. Cell behaviour and interpretation of impedance spectra" in the Journal of Applied Electrochemistry, Vol. 11 (1981) pages 573–582. This method, although it provides accurate results, has a drawback in that many measuring points are needed to determine D.

Argument a passes through a minimum at a frequency $f_{min}$ when impedance Z is measured within a frequency band ranging from 0.01 Hz to 10 kHz, as described in S.A.G.R. Karunathilaka et al's article "A state-of-charge test for the Li-CuO cell" in the Journal of Applied Electrochemistry, Vol. 13 (1983) pages 351–354. This frequency $f_{min}$, which varies according to the state of discharge of the battery, may also be used as a parameter for measuring D. The determination of $f_{min}$, however, requires a large number of measuring points.

As a final example, a method has been proposed wherein the real part R of impedance Z, measured at a given frequency, is used as a parameter representative of D. This method is described in S.A.G.R. Karunathilaka et al's article entitled "The prediction of the state-of-charge of some commercial primary cells" in the Journal of Applied Electrochemistry, Vol. 13 (1983) pages 577–586. The main drawback of this method is the difficulty in finding a frequency at which the correlation between R and the state of discharge is satisfactory. Also, the ohmic resistance of the battery has an influence on and diminishes the accuracy of the measurements.

SUMMARY OF THE INVENTION

A main object of the invention is to provide a measuring method, based on the determination of the argument of an impedance, which does not suffer from the same drawbacks.

To achieve this object, the invention provides a method of measuring the state of discharge of a battery, which comprises:

measuring a first internal impedance of the battery at a first frequency;

measuring a second internal impedance of the battery at a second frequency;

determining the difference between the two internal impedances measured; and determining the argument of this difference, said argument being representative of the state of discharge of the battery.

One advantage of the measuring method according to the invention is that the voltage drop due to the internal ohmic resistance of the battery no longer distorts the determination of the remaining capacity of the battery. Another advantage of the method is that it does not require a large number of measuring points.

A further object of the invention is to provide measuring apparatus able to ascertain in a rapid, accurate and non-destructive manner the state of discharge of a battery without diminishing its capacity significantly, by carrying out the measuring method according to the invention.

DETAILED DESCRIPTION

Figure 1:
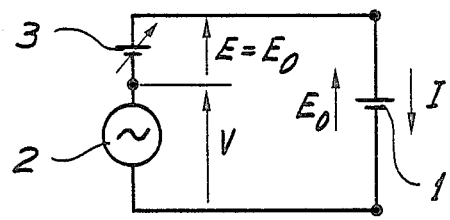
FIG. 1 is a diagram of a circuit for measuring the complex internal impedance of a battery.

The measuring method according to the invention being based on the determination of the argument of a complex impedance deduced from the internal complex impedance of a battery, the definition and the measuring method of this latter variable will first be described with reference to the circuit shown in FIG. 1. This circuit comprises a battery to be measured 1, an a.c. voltage generator 2 of variable frequency f and a variable generator 3 of d.c. voltage. The battery and the two generators are connected in series in any order but in such a way that the battery and the d.c. voltage generator have in common poles of the same sign, in this case the positive poles. The internal impedances of the generators are considered negligible compared to those of the battery. The no-load voltage of battery 1 is shown as $E_0$, the effective voltage of generator as V and the d.c. voltage of generator 3 as E. Voltage E is so chosen as to be equal to $E_0$ to prevent battery 1 issuing a direct current. In this way, the current flowing in the loop made up of the battery and the two generators has no direct component and its alternating component I is determined only by voltage V.

The direct component may also be blocked by replacing generator 3 by a capacitor, but its capacitance would soon become prohibitive at very low frequencies.

Variables V and I are complex numbers and their ratio $V/I = Z = R + jX$ defines the internal complex impedance of battery 1. This impedance Z has a real or resistive part R, and an imaginary or reactive part X, whose ratio $X/R = \tan a$ defines argument a of the impedance.

Argument a has a value arc tan $X/R$ which is equal to the phase lag or phase difference of current I with respect to voltage V.

Figure 2:
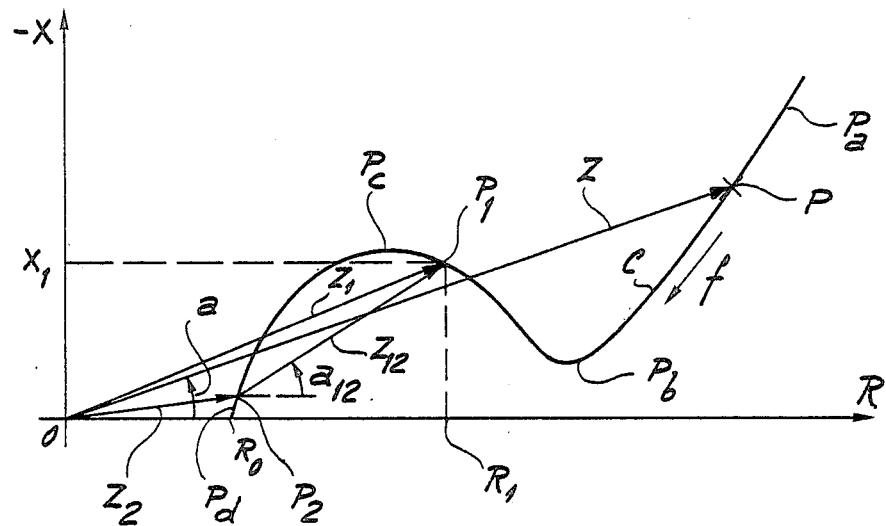
FIG. 2 shows the curve followed within a complex plane by the end of a vector representing the internal impedance of a battery, the frequency of measurement being used as a variable parameter.

In a complex plane where resistance R is represented on the real axis and reactance X on the imaginary axis, both axes having a common origin O, each frequency f corresponding to a point P of the plane, as shown in FIG. 2. Vector OP depicts impedance Z and the angle between the vector and the real axis is equal to argument a. As measurement frequency f increases, point P follows a curve C in the direction of points $P_a$, $P_b$, $P_c$, $P_d$. Curve C is made up of a roughly rectilinear segment $P_a$-$P_b$, followed by a segment $P_b$-$P_c$-$P_d$ approximately shaped like an arc of a circle. With some batteries, the high frequency portion of curve C is shaped more like a straight line having a slope less than that of the low frequency portion $P_a$-$P_b$. This difference in shape of the response at low frequencies does not affect the effectiveness of the proposed method. The reactive part X of impedance Z is capacitive and therefore has a negative value. Measuring voltage V lies typically between 1 and 10 mV and measurement frequency f between 0.01 and 1 Hz for segment $P_a$-$P_b$ and between 1 Hz and 10 kHz for arc $P_b$-$P_c$-$P_d$. These frequency values are typical for a new battery; they vary with the state of discharge. With frequencies in the region of 10 kHz or more the reactive part X is practically zero and impedance Z thus only amounts to the internal ohmic resistance $R_0$ of the battery.

In the known measuring method wherein the argument of the internal impedance of the battery is used as a parameter representative of its state of discharge, the measurement frequency is usually so chosen that the corresponding point P lies between points $P_b$ and $P_c$, on the circular part of curve C. This frequency, designated $f_1$, is associated with impedance $Z_1$, resistance $R_1$, reactance $X_1$ and point $P_1$ on curve C, as shown in FIG. 2.

Figure 2A:
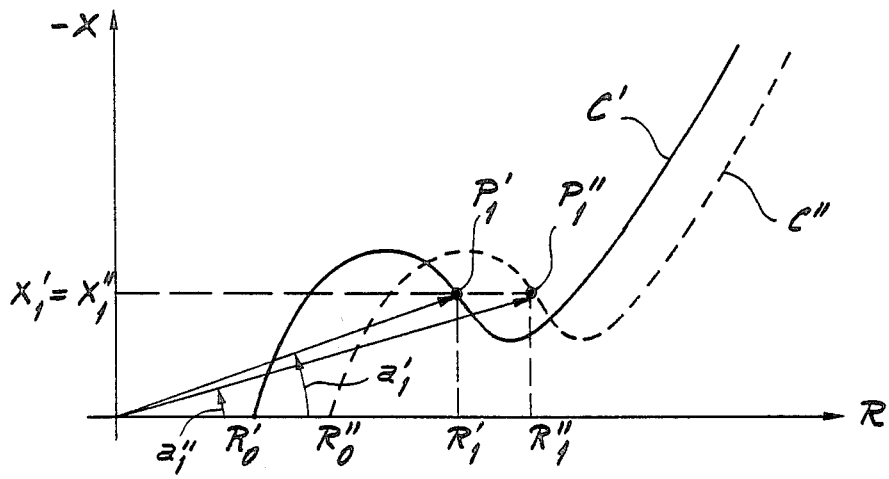
FIG. 2a shows the influence of the internal ohmic resistance of a battery on curve C in FIG. 2.

Two batteries of the same kind will now be considered, both being in the same state of discharge and having different internal resistances $R'_0$ and $R''_0$. In the complex plane, curves C' and C", which are representative of the impedance of these batteries, are identical but shifted one with respect to the other along the real axis as shown in FIG. 2a. Obviously therefore with measurement frequency $f_1$, at points $P'_1$ and $P''_1$, reactances $X'_1$ and $X''_1$ will be identical for both batteries whereas a difference will occur between resistances $R'_1$ and $R''_1$. This difference is equal to that between the internal ohmic resistances $R'_0$ and $R''_0$ of the two batteries. Clearly, as argument $a_1$ is equal to arc tan $X_1/R_1$, two different values $a'_1$ and $a''_1$ will be obtained for this parameter due to the gap between the two values of $R_1$, and therefore of $R_0$. This mesaurement will thus provide different values for the state of discharge D, although the remaining capacities were originally assumed to be equal for both batteries.

The main object of the invention is to eliminate the influence of $R_0$ in measurement of D by choosing a parameter representative of the state of discharge of a battery which does not vary with respect to any shift of curve C in the complex plane.

To achieve this object, the measuring method according to the invention comprises measuring first and second values $Z_1$ and $Z_2$ of the internal impedance of the battery, at frequencies $f_1$ and $f_2$ respectively, and using argument $a_{12}$ of the difference $Z_{12}=Z_1-Z_2$ as the parameter representative of its state of discharge D, as shown in FIG. 2. If $R_1$, $R_2$ and $X_1$, $X_2$ respectively designate the real and imaginary parts of $Z_1$ and $Z_2$, argument $a_{12}=$arc tan $(X_1-X_2)/(R_1-R_2)$. As $R_1-R_2$ is independent of $R_0$, the same applies to $a_{12}$, which is a first advantage. A second advantage of this method is that only two impedance measurements are required.

For best results, frequency $f_2$ is chosen such that the reactive part $X_2$ of the internal impedance is practically zero at that frequency. This frequency lies typically between 3 and 10 kHz. Under these conditions resistance $R_2$ becomes approximately equal to $R_0$. The expression defining argument $a_{12}$ thus reads $a_{12}=$arc tan $X_1/(R_1-R_0)$. Frequency $f_1$ can be chosen by measuring the values of $a_{12}$ for a series of frequencies between 0.01 Hz and 10 kHz and by setting $a_{12}=$function (log $f_1$) for several states of discharge ranging from 0 to 100% of D. A study of the group of curves $a_{12}=$function (log $f_1$) enables the most appropriate frequency $f_1$ to be chosen for a selection made at a given state of discharge. Frequency $f_1$ typically lies between 0.1 and 10 Hz.

Argument $a_{21}$ of impedance $Z_2-Z_1$ could equally well have been chosen as a parameter representative of D instead of argument $a_{12}$ of impedance $Z_1-Z_2$ since, the vectors corresponding to impedances $Z_2-Z_1$ and $Z_1-Z_2$ being of oppositve direction, $a_{21}=a_{12}+180°$. As the two arguments differ only by a constant, they are both equally representative of D.

Figure 3:
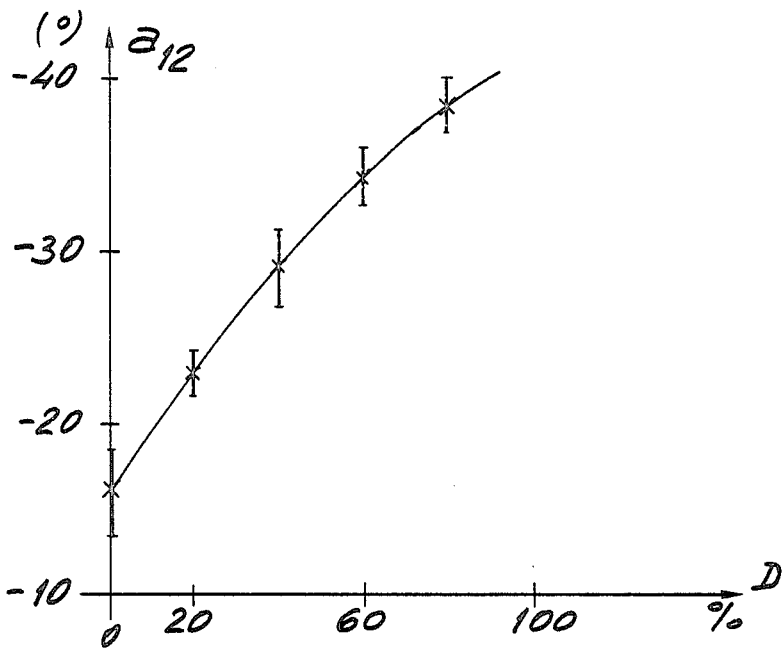
FIG. 3 shows an example of curve obtained by the method according to the invention linking the state of discharge of a battery with the argument of the complex impedance obtained by subtracting from a first internal impedance of the battery, measured at a first frequency, a second internal impedance, measured at a second frequency.

An example of the relationship between argument $a_{12}$, measured in degrees, and the state of discharge D of a battery, expressed in %, is shown in FIG. 3. A batch of five $Ag_2O$-Zn batteries of 30 mAh nominal capacity was used for the measurements at each state of discharge. The measurements were made with an a.c. voltage V of 2 mV at frequencies $f_1$ and $f_2$ of 4 Hz and 10 kHz respectively. The curve is formed by joining the points representing the average values of $a_{12}$. The segments associated with these points show the extreme values obtained. It will be noted that $a_{12}$ varies rapidly with respect to D and that the scattering of the measurement points is small.

Argument $a_{12}$ usually varies from $-10°$ to $-50°$. An argument smaller than typically $-25°$ corresponds to a state of discharge less than 30% of D.

Figure 4:
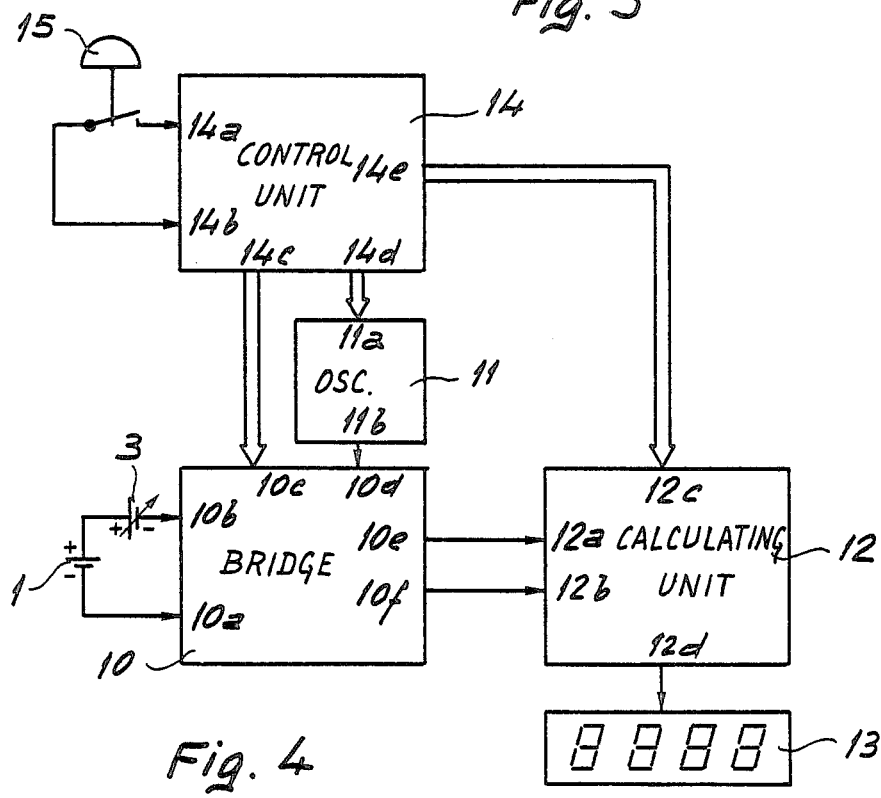
FIG. 4 is a diagram of an apparatus for measuring the state of discharge of a battery, in accordance with the invention.

Electronic apparatus for carrying out the method of measurement according to the invention and able to determine in a simple, rapid, accurate and non-destructive manner the state of discharge of a battery, will now be described with reference to FIG. 4.

The illustrated apparatus comprises the battery to be measured 1, the variable generator 3 of d.c. voltage, a measuring bridge 10, an oscillator 11 able to supply frequencies $f_1$ and $f_2$, a calculating unit 12, a display unit 13, e.g. digital, to indicate the results, a control unit 14 and a switch actuated by a push-button 15.

Measuring bridge 10 has two inputs 10a and 10b for connection to the impedance to be measured, a control input 10c, an input 10d to which the measurement frequency is applied and two outputs 10e and 10f supplying the values of the resistive and reactive parts respectively of the impedance to be measured. Oscillator 11 has a control input 11a and an output 11b which issues a signal having the measurement frequency $f_1$ or $f_2$. Calculating unit 12 has two inputs 12a and 12b for receiving the values of the resistive and reactive parts respectively of the impedance to be measured, a control input 12c and an output 12d which issues the result of the calculation performed by the unit on the variables entered on inputs 12a and 12b. Display unit 13 has one input which receives the value to be displayed. Finally, control unit 14 has two inputs 14a and 14b and three control outputs 14c, 14d and 14e.

The negative terminal of battery 1 is connected to input 10a of bridge 10. The positive terminal of battery 1 is connected to the positive terminal of d.c. voltage generator 3 whose negative terminal is connected to input 10b of bridge 10. The voltage of generator 3 is so adjusted as to compensate exactly the no-load voltage of battery 1 in order to prevent it from issuing a direct current. Input 10c of bridge 10 is connected to output 14c of control unit 14 and input 10d of bridge 10 is connected to output 11b of oscillator 11. Outputs 10e and 10f of bridge 10 are respectively connected to inputs 12a and 12b of calculating unit 12 whose input 12c is connected to output 14e of control unit 14. Output 12d of calculating unit 12 is connected to the input of display unit 13, in order to display $a_{12}$ or directly D after calibration of the apparatus. Finally input 11a of oscillator 11 is connected to output 14d of control unit 14 whose inputs 14a and 14b are connected to the two terminals of a switch activated by push-button 15. The energy source supplying the various circuits of the apparatus is not shown.

The apparatus shown in FIG. 4 operates as follows. After setting up battery 1 to be tested, a measurement sequence is initiated by depressing push-button 15. The various stages of the measurement sequence are controlled by unit 14 which issues, in an order defined in a program, control signals to bridge 10, to oscillator 11 and to calculating unit 12. The first stage includes controlling oscillator 11 such that it will issue on its output measurement frequency $f_1$, controlling bridge 10 such that it will measure $Z_1$ and cause the value of $R_1$ to be issued on its output 10e and the value of $X_1$ to be issued on its output 10f, and finally controlling calculating unit 12 such that it will memorize the values of $R_1$ and $X_1$. The second stage is similar to the first except that control of the oscillator will cause measurement frequency $f_2$ to issue on its output and that, in the end, calculating unit 12 will memorize the values of $R_2$ and $X_2$. Finally, the third stage includes so controlling calculating unit 12 that it will calculate, on the basis of the memorized values of $R_1$, $R_2$, $X_1$ and $X_2$, the value of argument $a_{12}=$arc tan $(X1-X2)/(R_1-R_2)$ and cause this value to be displayed by unit 13. Calculating unit 12 may contain in its memory correspondence tables between $a_{12}$ and D, each table corresponding to a given type of battery whereby the actual value of state of discharge D of the battery can be directly displayed by unit 13.

For good results, measuring bridge 10 may be a Frequency Response Analyser 1174 by Solartron, into which oscillator 11 is incorporated, and d.c. voltage generator 3 may be an Electrochemical Interface 1186 by the same manufacturer. Finally, the functions of calculating unit 12, display unit 13 and control unit 14 are preferably performed by a mini-computer, e.g. a Desktop Computer 9825 by Hewlett-Packard.

What is claimed is:

1. A method of measuring the state of discharge of a battery having an internal impedance, which comprises:
   (a) measuring a first internal complex impedance of the battery at a first frequency;
   (b) measuring a second internal complex impedance of the battery at a second frequency;
   (c) determining the complex difference between said internal complex impedances; and
   (d) determining the argument of said complex difference, said argument being representative of the state of discharge of the battery.

2. A method of measurement as in claim 1, wherein the lower of said frequencies lies between 0.1 and 10 Hz.

3. A method of measurement as in claim 1, wherein the higher of said frequencies is such that the reactive part of said internal impedance is approximately zero at this frequency.

4. A method of measurement as in claim 1, wherein the higher of said frequencies is in the region of 10 kHz.

5. Measuring apparatus for ascertaining the state of discharge of a battery, which comprises means for preventing the battery from issuing a direct current, means for measuring a first internal complex impedance of the battery at a first frequency and a second internal complex impedance of the battery at a second frequency, means for determining the complex difference between said internal complex impedances and the argument of said complex difference, and means for displaying the value of said argument, said argument being representative of the state of discharge of the battery.

* * * * *